(12) United States Patent
Geisler et al.

(10) Patent No.: US 10,326,621 B1
(45) Date of Patent: Jun. 18, 2019

(54) SERIAL COMMUNICATION SYSTEM WITH ACTIVE DRIVER

(71) Applicant: Allegro MicroSystems, LLC, Manchester, NH (US)

(72) Inventors: Dominik Geisler, Heidelberg (DE); Jesse Lapomardo, Pembroke, NH (US)

(73) Assignee: Allegro MicroSystems, LLC, Manchester, NH (US)

( * ) Notice: Subject to any disclaimer, the term of this patent is extended or adjusted under 35 U.S.C. 154(b) by 0 days.

(21) Appl. No.: 15/968,291

(22) Filed: May 1, 2018

(51) Int. Cl.
*H04B 3/00* (2006.01)
*H04L 25/02* (2006.01)
*H04B 3/06* (2006.01)
*H03K 17/687* (2006.01)

(52) U.S. Cl.
CPC ....... *H04L 25/028* (2013.01); *H03K 17/6872* (2013.01); *H04B 3/06* (2013.01)

(58) Field of Classification Search
CPC ..... H04L 25/028; H03K 17/6872; H04B 3/06
USPC ........................ 375/238, 257, 340
See application file for complete search history.

(56) References Cited

U.S. PATENT DOCUMENTS

| | | | |
|---|---|---|---|
| 8,183,982 B2 | 5/2012 | Scherr | |
| 8,519,819 B2 | 8/2013 | Scherr | |
| 8,577,634 B2 | 11/2013 | Donovan et al. | |
| 8,922,331 B2 | 12/2014 | Scherr | |
| 9,172,565 B2 | 10/2015 | Cadugan et al. | |
| 9,374,174 B1* | 6/2016 | Hammerschmidt | H04L 25/0278 |
| 9,634,715 B2 | 4/2017 | Scheinkerman et al. | |
| 9,739,846 B2 | 8/2017 | Petrie et al. | |
| 9,787,495 B2 | 10/2017 | Vreeland et al. | |
| 2015/0236746 A1* | 8/2015 | Scheinkerman | H04B 1/40 375/219 |
| 2016/0097825 A1* | 4/2016 | Petrie | G01R 33/072 324/207.22 |

OTHER PUBLICATIONS

Allegro Datasheet A1341; "High Precision, Programmable Linear Hall Effect Sensor IC with EEPROM, SENT and PWM Output Protocols, and Advanced Output Linearization"; Jan. 4, 2018; 53 pages.

Allegro Datasheet A1342; "Programmable Linear Hall IC with Advanced Diagnostics for Safety-Critical Applications"; Dec. 2, 2016; 48 pages.

Allegro Datasheet A1343; "High-Precision, Highly Programmable Linear Hall-Effect Sensor IC with EEPROM, Output Protocols SENT and PWM, and Advanced Output Linearization"; May 25, 2017; 53 pages.

(Continued)

*Primary Examiner* — Dhaval V Patel
(74) *Attorney, Agent, or Firm* — Daly, Crowley, Mofford & Durkee, LLP

(57) ABSTRACT

A serial communication system includes transmission line and at least one slave device. The at least one slave device comprises an active pull-down element coupled to the transmission line to pull a voltage on the transmission line low during transmission, an active pull-up element coupled to the transmission line to pull the voltage on the transmission line high during or after transmission, and a communication circuit configured to transmit data onto the transmission line according to a SENT protocol by activating the pull-down element and the pull-up element.

22 Claims, 4 Drawing Sheets

(56) References Cited

OTHER PUBLICATIONS

Allegro Datasheet A1346; "Dual-Die Programmable Linear Hall IC with Advanced Diagnostics for Safety-Critical Applications"; Sep. 20, 2017; 48 pages.
Allegro Datasheet A1335; "Precision Hall-Effect Angle Sensor IC with I$^2$C, SPI, and SENT Interfaces"; Jan. 2016; 29 pages.
Allegro Datasheet A1337; "Precision, Hall-Effect Angle Sensor IC with SPI, and SENT or PWM Outputs"; Jan. 24, 2018; 35 pages.
Allegro Datasheet A1338; "Precision, Hall-Effect Angle Sensor IC with SPI, and SENT or PWM Outputs"; Jan. 25, 2018; 31 pages.
U.S. Appl. No. 15/915,185, filed Mar. 8, 2018, Kozomora et al.

\* cited by examiner

SERIAL COMMUNICATION SYSTEM WITH ACTIVE DRIVER

FIELD

This disclosure relates to serial communication systems.

BACKGROUND

The Singled Edge Nibble Transmission (SENT) protocol is a one-wire, serial communication protocol used in a variety of applications. The SENT protocol relies on a passive pull-up mechanism (such as a pull-up resistor) to maintain the one-wire bus at a logic-high voltage level. To transmit data, devices communicating on the bus typically drive the bus low, then release the bus and allow the pull-up resistor to pull the bus high. The rise-time of a low-to high transition on the bus may be a function of the supply voltage, the value of the pull-up resistor (which can vary from 10 kΩ to 55 kΩ according to the SENT specification), any protective devices (active or passive), and any capacitance (parasitic or otherwise) coupled to the bus.

SUMMARY

In an embodiment, a SENT communication system includes a transmission line and at least one slave device. The at least one slave device comprises an active pull-down element coupled to the transmission line to pull a voltage on the transmission line low during transmission, an active pull-up element coupled to the transmission line to pull the voltage on the transmission line high during or after transmission, and a communication circuit configured to transmit data onto the transmission line according to a SENT protocol by activating the pull-down element and the pull-up element.

In another embodiment, a method of communicating on a SENT communication line includes coupling an active pull-down element to the transmission line to pull a voltage on the transmission line low during transmission, coupling an active pull-up element to the transmission line to pull the voltage on the transmission line high during transmission, and transmitting data onto the transmission line according to a SENT protocol by activating the pull-down element and the pull-up element.

In another embodiment, a SENT communication system comprises a transmission line and at least one slave device. The at least one slave device includes an active pull-down element coupled to the transmission line to pull a voltage on the transmission line low during transmission, and means for pulling up the voltage on the transmission line to provide a logic-high voltage on the transmission line.

BRIEF DESCRIPTION OF THE DRAWINGS

The foregoing features may be more fully understood from the following description of the drawings. The drawings aid in explaining and understanding the disclosed technology. Since it is often impractical or impossible to illustrate and describe every possible embodiment, the provided figures depict one or more exemplary embodiments. Accordingly, the figures are not intended to limit the scope of the invention. Like numbers in the figures denote like elements.

DETAILED DESCRIPTION

Digital communication on a serial bus generally may be achieved by driving two voltage states on a communication bus. This may be the case for single-ended or differential buses. In this disclosure, one of these voltage states may be referred to as "high" and/or "logic-high," and the other state may be referred to as "low" and/or "logic-low." According to the Singled Edge Nibble Transmission (SENT) protocol, the high state corresponds to 5V and the low state corresponds to 0 V. In this disclosure, "high" and "low" may refer to the SENT protocol high and low states, or to any two voltage states that can be used for digital communication.

The SENT protocol is a one-wire, serial communication protocol used in a variety of applications. The SENT protocol relies on a passive pull-up mechanism (such as a pull-up resistor) to maintain the one-wire bus at a logic-high voltage level. To transmit data, devices communicating on the bus typically drive the bus low, then release the bus and allow the pull-up resistor to pull the bus high. The rise-time of a low-to high transition on the bus may be a function of the supply voltage, the value of the pull-up resistor, and any capacitance (parasitic or otherwise) coupled to the bus. In certain applications, bus speed may be limited by slow rise times during transmissions.

Figure 1:
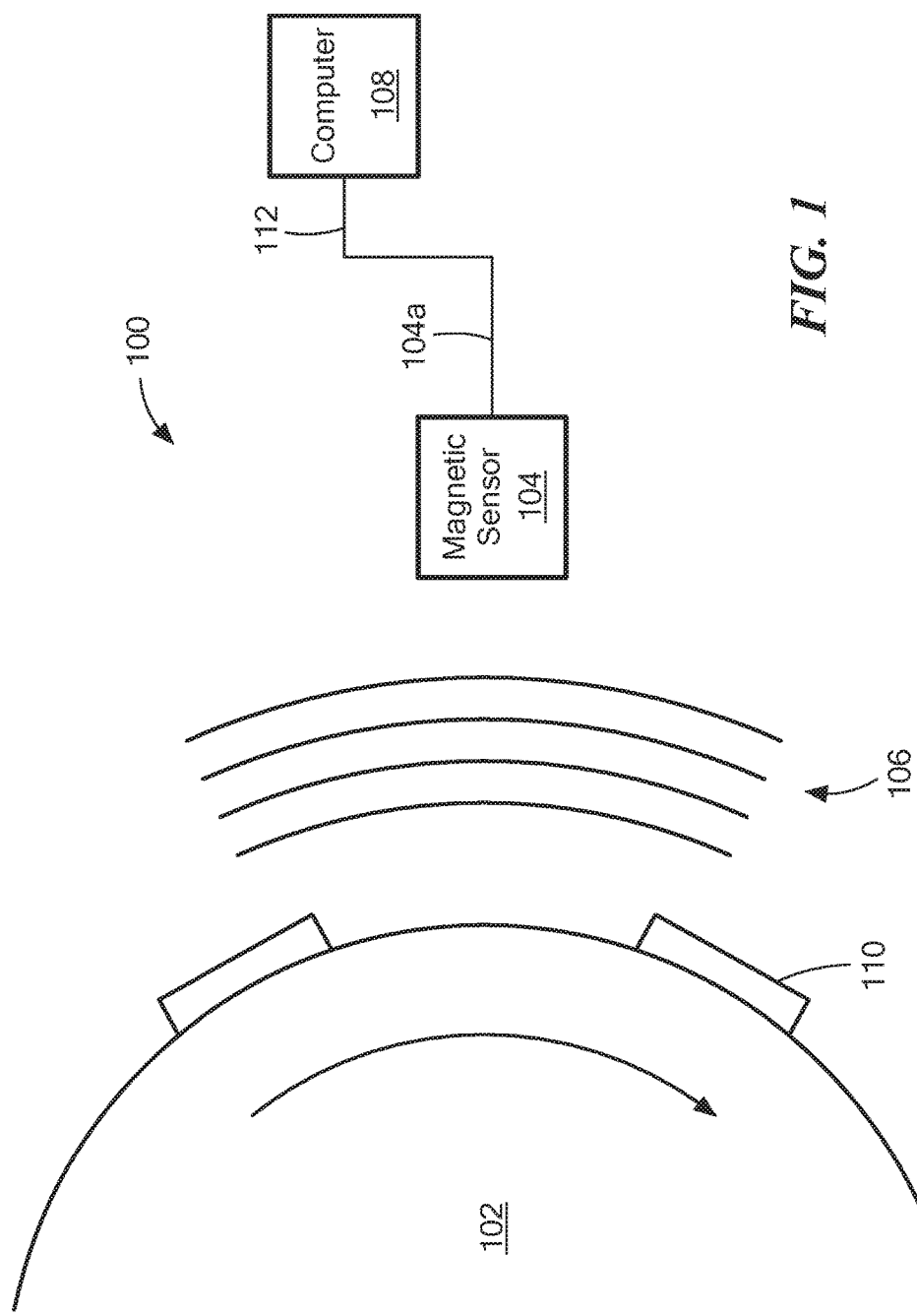
FIG. 1 is a block diagram of a communication system including a magnetic field sensor.

FIG. 1 is a block diagram of a system 100 for detecting a magnetic field 106. In embodiments, the magnetic field may be produced by target 102. In other embodiments, other types of targets may be used. System 100 includes a magnetic field sensor 104 placed adjacent to target 102 so that a magnetic field 106 can be sensed by magnetic field sensor 104.

In an embodiment, target 102 is a magnetic target and produces magnetic field 106. In another embodiment, magnetic field 106 is generated by a magnetic source (e.g. a back-bias magnet or electromagnet) that is not coupled to target 102. In such embodiments, target 102 may be a ferromagnetic target that does not itself tend to generate a magnetic field. In this case, as target 102 moves through or within magnetic field 106, it causes perturbations to magnetic field 106 that can be detected by magnetic field sensor 104.

Magnetic field sensor 104 may be coupled to a computer 108, which may include a general-purpose processor executing software or firmware, a custom processor, or an electronic circuit for processing output signal 104a from magnetic field sensor 104. Output signal 104a may provide information about the speed, direction, and/or position of target 102 to computer 108, which may then perform operations based on the received information.

In an embodiment, computer 108 is an automotive computer installed in a vehicle and target 102 is, or is coupled to, a moving part within the vehicle, such as a transmission shaft, a brake rotor, pedal position, steering column torque, etc. Magnetic field sensor 104 can detect the speed, position, and/or direction of target 102 and, in response, computer 108 may control automotive functions (like all-wheel drive, ABS, throttle valve control, power steering motor control, etc.).

In embodiments, target 102 may be a gear having teeth 110. In other embodiments, target 102 may be a linear target that may move laterally with respect to magnetic field sensor 104.

Sensor 104 may communicate with computer 108 using a serial communication protocol. For example, sensor 104 may communicate using a single-line protocol, such as the SENT protocol, the I²C protocol, or the like. In this case, signal 104a may travel on a single wire bus 112. In other embodiments, other protocols may be used and signal 104a may travel over a differential wire or a bus.

FIG. 1 depicts two communication devices coupled to bus 112: magnetic field sensor 104 and computer 108. One device (such as computer 108) may act as a host or master device and the other (such as magnetic field sensor 104) may act as a slave device. In other words, computer 108 may send data requests to magnetic field sensor 104, which will respond by sending data to computer 108. A host device may initiate communications and a slave device will respond to requests from the host device. In other applications, magnetic field sensor 104 may transmit data over bus 112 without first receiving a request. Of course, other query/response schemes may be used.

Although FIG. 1 shows two devices coupled to bus 112, other numbers of devices may be coupled to and communicate on bus 112. In some cases, multiple sensors may be coupled to and act as slave devices on bus 112. Computer 108 may be configured to address one or more slave devices coupled to bus 112. U.S. Pat. No. 9,172,565 (filed Feb. 18, 2014), U.S. Pat. No. 9,634,715 (filed Mar. 12, 2015), and U.S. Pat. No. 9,787,495 (filed Mar. 12, 2015) provide examples of communication schemes to address multiple slave devices. These patents are incorporated here by reference in their entirety.

Figure 2:
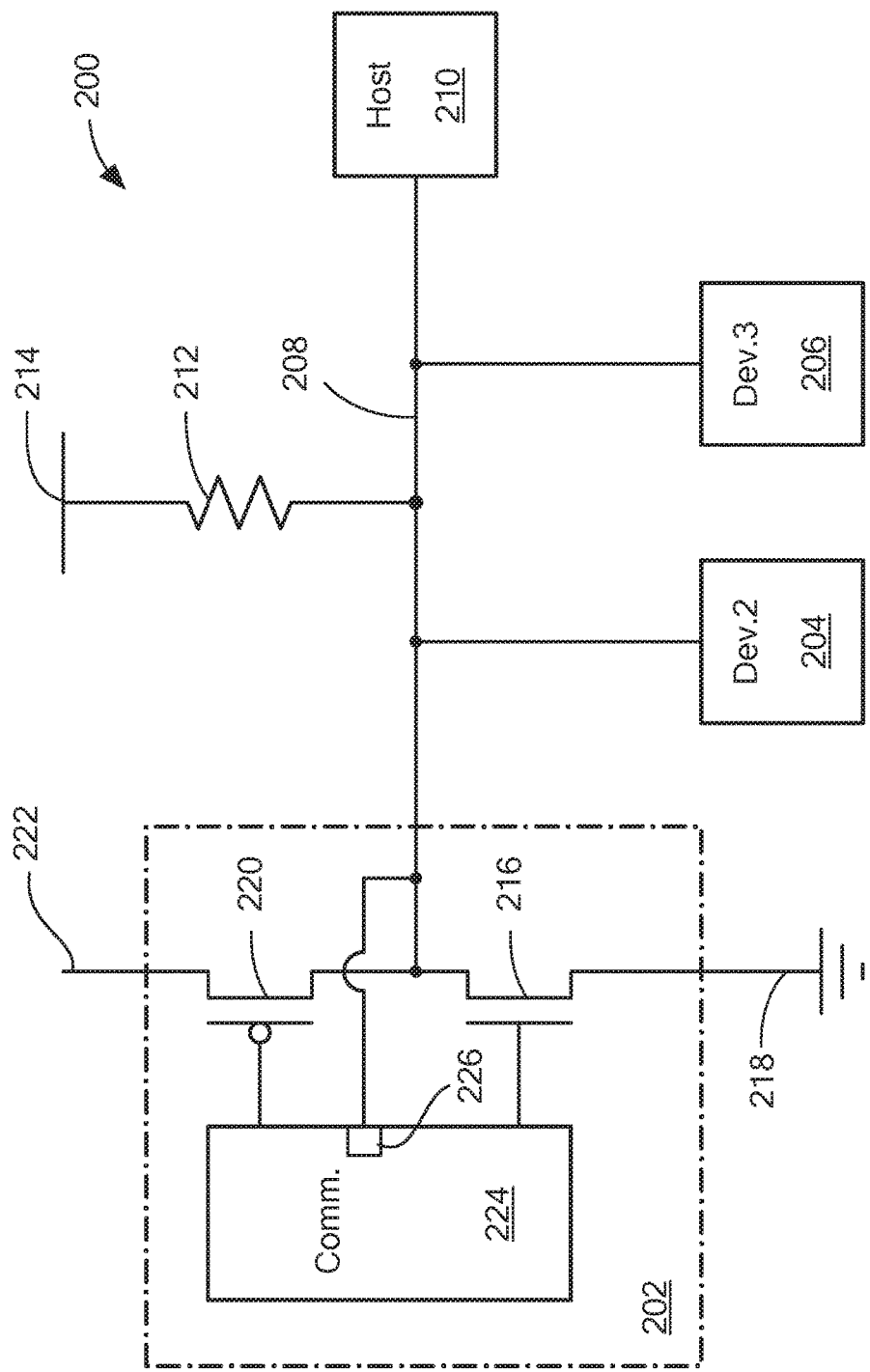
FIG. 2 is a block diagram of a communication system.

Referring to FIG. 2, communication system 200 includes communication devices 202, 204, and 206 coupled to a communication bus 208. A host device 210 is also coupled to communication bus 208. Communication devices 202, 204, and 206 may be any circuit capable of communicating on bus 208. In embodiments, communication devices 202, 204, and/or 206 may be sensors similar to or the same as magnetic field sensor 104. Host device 210 may be the same as or similar to computer 108. Bus 208 may be a one-wire bus the same as or similar to bus 112.

In embodiments, communication devices 202, 204, 206 and host device 210 communicate on bus 208 according to aspects of the SENT protocol.

System 200 may include a pull-up resistor 212 coupled between bus 208 and a power source 214. When the devices coupled to bus 208 are not driving bus 208 low, pull-up resistor 212 may pull the voltage on bus 208 up to the voltage level of the power source 214. This may correspond to a logic-high voltage level. In system 200, pull-up resistor 212 is shown as an external pull-up resistor (i.e. it is external to the communication devices). In other embodiments, one or more of communication devices 202, 204, 206 and host device 210 may include an internal pull-up resistor coupled to an internal or external power rail that pulls the voltage on bus 208 up to a logic-high.

Communication device 202 may include an active pull-down element 216 coupled between bus 208 and a voltage reference 218. The voltage reference may be ground, or any other voltage reference that can act as a logic-low voltage level for bus 208. Active pull-down element 216 may be a controlled current source that can direct current from 208 to the logic-low reference voltage. In an embodiment, active pull-down element 216 is a transistor, such as a field-effect transistor (FET).

Communication device 202 may also include an active pull-up element 220 coupled between bus 208 and a voltage source 222. Voltage source 222 may be coupled to or may be the same as voltage reference 214. In general, voltage reference 214 may be any voltage reference that can act as a logic-high voltage level for bus 208. Active pull-up element 220 may be a controlled current source that can direct current from the logic-high reference to bus 208. In an embodiment, active pull-up element 220 is a transistor, such as a field-effect transistor (FET).

When bus 208 is idle (i.e. when no device is driving data or other information onto bus 208), bus 208 may be held in a logic-high state by pull-up resistor 212. Additionally or alternatively, when bus 208 is idle, communication device 202 may drive bus 208 to a logic-high state by placing active pull-up element 220 into a conducting state.

Communication device 202 may include a communication circuit 224 coupled to active pull-up element 220 and active pull-down element 216. Communication circuit 224 may be configured to activate and deactivate active pull-up element 220 and active pull-down element 216. For example, if active pull-up element 220 and active pull-down element 216 are FETs, communication circuit 224 may be coupled to the gate terminals of the FETs to control the FETs. In embodiments, communication circuit 224 may drive the FETs so they act like controlled current sources (i.e. activating the FETs so they conduct and pull the bus 208 to a respective voltage rail and deactivating the FETs so they act like open circuits).

Communication circuit 224 may include logic and/or control circuitry such as a state machine that can activate and deactivate active pull-up element 220 and active pull-down element 216 to drive the voltage on bus 208 up and down during data transmission. In other embodiments, communication circuit 224 may include analog circuits such as current mirrors that can activate and deactivate active pull-up element 220 and active pull-down element 216 to drive the voltage on bus 208 up and down during data transmission.

Active pull-up element 220 may drive bus 208 to a logic-high voltage level faster than pull-up resistor 212. For example, if communication circuit 224 controls active pull-up element 220 so it acts like a closed switch, the resistance between node 222 and bus 208 may be very small, potentially smaller than the resistance of pull-up resistor 212. Additionally, if active pull-up element 220 is in a conducting state (i.e. not in an open-switch state), then both active pull-up element 220 and pull-up resistor 212 will drive bus 208 to a voltage high level. In these cases, as active pull-up element 220 drives bus 208 high, the rise time of the voltage on the bus 208 may be smaller than the rise time that would have occurred if only pull-up resistor 212 were driving bus 208 high.

Communication circuit 224 may include an input pin or terminal 226 coupled to bus 208 so that communication circuit 224 can detect a logic-high state and a logic-low state on bus 208. Input pin 226 may be coupled to a logic gate, or other circuit internal to communication circuit 224 that can process a logic signal indicating if bus 208 is in a logic-high or logic-low state. Communication circuit 224 can use input pin 226 to determine if another communication device, such as communication device 204, 206, or host device 210, is communicating on bus 208.

In embodiments, active pull-down element 216 may be able to drive the bus 208 harder than active pull-up element 220 so that, if both devices 216 and 220 are active, bus 208 will be pulled low to a logic-low level. This may be accomplished by choosing a FET so that active pull-down element 216 can sink more current than active pull-up element 220 can source, or by controlling the gate levels of 220 and 216 to the effect that 216 will sink more current than 220 will source. In embodiments, active pull-down element 216 is configured to sink more current than may be sourced by multiple active pull-up elements 220. Thus, if multiple communication devices are simultaneously driving bus 208, a single active pull-down element 216 may drive bus 208 low to a logic-low voltage level.

Active pull-down element 216 may be configured to sink more current than active pull-up element 220 if, for example, active pull-down element 216 comprises a FET which, when in a conducting state, can sink more current than one or more active pull-up elements 220. Additionally or alternatively, communication circuit 224 may be configured to drive the gate node of active pull-down element 216 so that active pull-down element 216 is in a conducting state and drive the gate node of active pull-up element 220 so that active pull-up element 220 operates in the linear/resistive region. The current through active pull-down element 216 may also be controlled by the voltage across the drain and source nodes of the FET.

Figure 3:
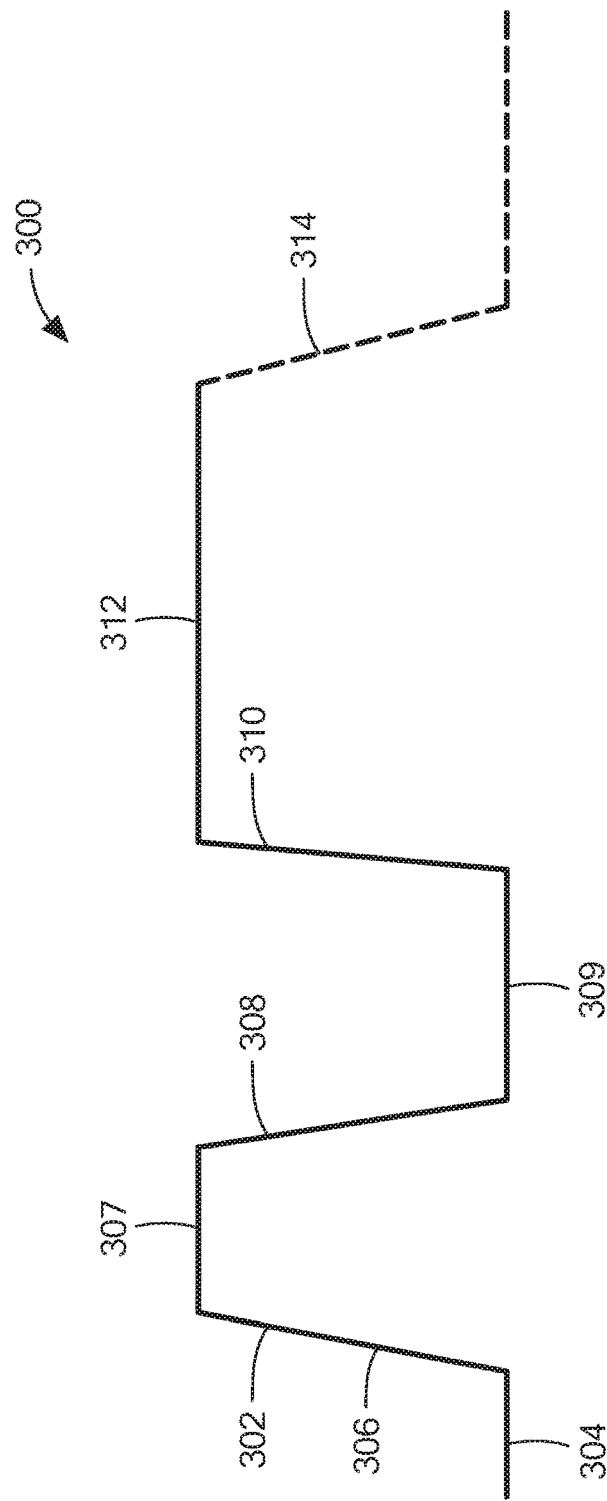
FIG. 3 is a timing diagram of a SENT transmission.

Referring to FIG. 3, timing diagram 300 includes voltage waveform 302, which may represent the voltage on bus 208 during data transmission. During time period 304, active pull-down element 216 may be "on" (i.e. in a conducting state) and may pull the voltage on bus 208 low. Subsequently, active pull-down element 216 may turn off, and active pull-up element 220 may turn on to drive the voltage on bus 208 high, as shown by rising edge 306. During time period 307, active pull-up element 220 may remain on to hold the voltage on bus 208 high, which may improve immunity to interference on the transmission line.

Subsequently, active pull-down element 216 may turn on, and active pull-up element 220 may turn off, to drive the voltage on bus 208 low, as shown by falling edge 308. During time period 309, active pull-down element 216 may remain on, holding the voltage on bus 208 low. Again, active pull-down element 216 may turn off, and active pull-up element 220 may turn on, to drive the voltage on bus 208 high, as shown by rising edge 310.

In this example, rising edge 310 may indicate the end of a data transmission by communication device 202. Subsequently, during time period 312, active pull-up element 220 may continue to drive bus 208 high. Additionally, multiple communication devices such as communication devices 204, 206, and host device 210 may actively drive bus 208 high during time period 312. Alternatively, none of the communication devices may drive bus 208 high during time period 312. Instead, bus 208 may be pulled high by pull-up resistor 212.

At some point during time period 312, another device may signal initiation of a data transmission by pulling bus 208 low, as shown by falling edge 314. In some embodiments, if active pull-up device 220 is driving bus 208 when the other device initiates data transmission, communication circuit 224 may detect falling edge 314 initiated by the other device. In this case, communication device 224 may turn active pull-up element 220 off, so that it no longer drives bus 208 high, during the other device's data transmission. In other embodiments, active pull-up element 220 may continue to drive bus 208 high during the other device's data transmission.

By actively driving bus 208 high during rising edges 306 and 310, active pull-up element 220 may provide a faster rise time than would otherwise be achieved if only pull-up resistor 212 were pulling bus 208 high.

In embodiments, communication circuit 224 may include various settings for driving bus 208 high. These settings may be stored in a memory, such as a ROM, EEPROM, one or more registers, or other type of memory within communication device 202. Communication circuit 224 may access these settings during operation. Other settings may also be stored in memory including, but not limited to, a setting to enable active pull-up, a setting to dictate a particular communication protocol, a setting to determine if data is ready to transmit, a setting to determine if an external trigger was detected, etc.

For example, communication circuit 224 accesses a "push" setting. If push is enabled, communication circuit 224 may drive bus 208 high by activating active pull-up element 220 whenever a high state is required during data transmission. If push is disabled, communication circuit 224 may allow pull-up resistor 212 to pull the bus up without activating active pull-up element 220. Communication circuit 224 may also access a "post-push" setting. If "post-push" is enabled, communication circuit 224 may hold bus 208 high by activating active pull-up element 220 after a data transmission is completed. If "post-push" is disabled, communication circuit 224 may allow pull-up resistor 212 to hold bus 208 high after a data transmission without activating active pull-up element 220. Alternatively, if "post-push" is enabled, communication circuit 224 may hold bus 208 high by activating active pull-up element 220 during each high state of bus 208 during and after data transmission.

Figure 4:
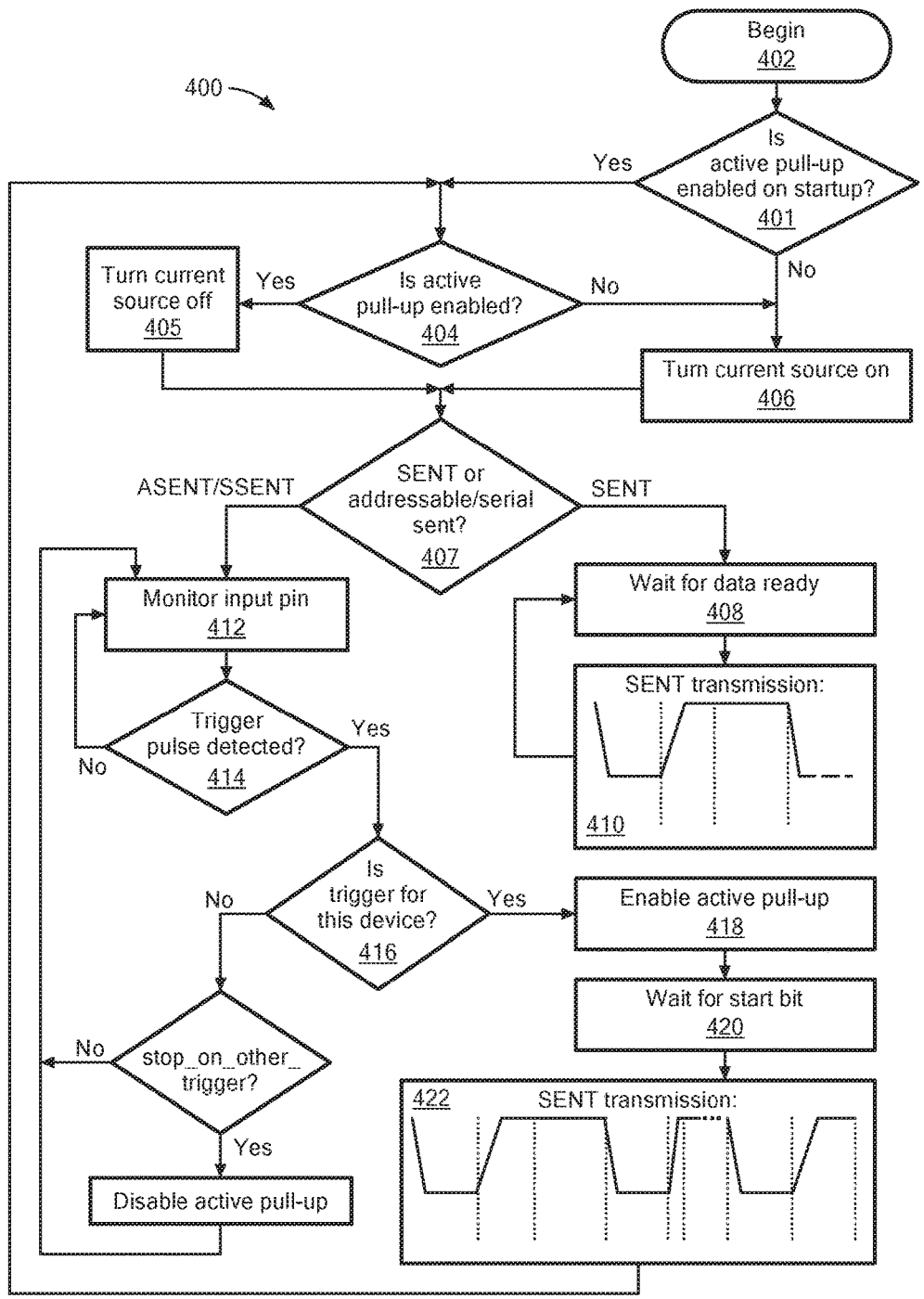
FIG. 4 is a flow diagram of a process for transmitting data.

Referring to FIG. 4, flow chart 400 provides an example of operation of communication circuit 224. In embodiments, flow chart 400 may be implemented by a state machine, by logic circuits, by software executed by a processor, or by any other circuitry to control the behavior of communication circuit 224. Flow chart 400 illustrates operation for normal SENT transmissions and for addressable SENT or shared SENT transmissions. Examples of addressable and shared SENT protocols can be found in U.S. Pat. No. 9,172,565 (filed Feb. 18, 2014), U.S. Pat. No. 9,634,715 (filed Mar. 12, 2015), and U.S. Pat. No. 9,787,495 (filed Mar. 12, 2015).

Referring also to FIG. 2, flowchart 400 begins in box 402. In box 401, communication circuit 224 checks to determine if active pull-up of bus 208 should be enabled during circuit start-up by, for example, accessing a setting stored in memory. If so, communication circuit 224 proceeds to box 406. If not, communication circuit proceeds to box 404. In box 404, communication circuit 224 determines if active pull-up of bus 208 should be enabled. If so, communication circuit 224 may turn current source 228 on in box 405 If not, communication circuit 224 may turn current source 228 off in box 406

In box 407, communication circuit 224 may determine if the protocol being used for transmission is the SENT protocol, or it is addressable SENT or shared SENT. These may differ in regards to whether the SENT pin is also used to receive triggers from the host. Instead of SENT, Addressable SENT or shared SENT, in other implementations, other protocols may be used. Communication circuit 224 may determine the protocol by, for example, accessing a setting stored in memory, as described above. If the SENT protocol is to be used, or another protocol in which no external input is expected from the serial output pin, communication circuit 224 may proceed to box 408 to wait until data is ready to transmit. When data is ready to transmit, communication circuit 224 may transmit data according to the SENT protocol, as shown in box 410.

The SENT or other serial transmission in box 410 may be the same as or similar to waveform 302 in FIG. 3. During rise times, communication circuit 224 may activate active pull-up element 220 to drive bus 208 high, as described above. At times when bus 208 is high, active pull-up element 220 may hold bus 208 high, as described above.

If, in box 407, communication circuit 224 determines that the protocol being used in addressable or Shared SENT, communication circuit 224 may monitor input pin 226 in box 412. During communication using addressable or Shared SENT, communication circuit 224 may wait to detect a trigger or address in box 414. Communication circuit 224 may then check, in box 416, to determine if the trigger or address was intended for communication device 202. If so, communication circuit 224 may proceed to box 418 to enable active pull-up device 220.

Communication circuit 224 may transmit data onto bus 208 according to the addressable or shared SENT protocol. The SENT transmission in box 422 may be the same as or similar to waveform 302 in FIG. 3. During rise times, communication circuit 224 may activate active pull-up element 220 to drive bus 208 high, as described above. At times when bus 208 is high, active pull-up element 220 may hold bus 208 high, as described above, as shown in box 422.

This disclosure refers to a communication system having an active pull-up resistor, active pull-up elements, and active pull-down elements that drives a communication bus However, one skilled in the art will recognize that the systems and techniques described here could be adapted to communication busses with a pull-down resistor. Also, although the embodiments listed above refer to the SENT protocol, the systems and techniques above may be used with other communication protocols.

The embodiments described above serve to illustrate various concepts, structures and techniques, which are the subject of this patent. Other embodiments incorporating these concepts, structures and techniques may be used. Accordingly, the scope of the patent should not be limited to the described embodiments but rather should be limited only by the spirit and scope of the following claims. All references cited in this patent are incorporated here by reference in their entirety.

The invention claimed is:

1. A communication system comprising:
a transmission line;
at least one slave device comprising:
an active pull-down element coupled to the transmission line to pull a voltage on the transmission line low during transmission;
an active pull-up element coupled to the transmission line to pull the voltage on the transmission line high during or after transmission; and
a communication circuit configured to transmit data onto the transmission line according to a SENT protocol by activating the pull-down element and the pull-up element;
wherein:
the communication circuit is configured to activate the active pull-up element to produce a rising edge within a transmission; and
the communication circuit is configured to activate the active pull-up element during a time period following the rising edge within the transmissions to improve immunity to interference on the transmission line, after the rising edge within the transmission is produced.

2. The communication system of claim 1 wherein the active pull-down element is a first field-effect transistor (FET) and the active pull-up element is second a FET.

3. The communication system of claim 2 wherein the communication circuit is coupled to a gate terminal of the first FET and a gate terminal of the second FET.

4. The communication system of claim 1 wherein the communication system comprises a pull-up resistor coupled between a voltage source and the transmission line.

5. The communication system of claim 1 wherein the communication circuit is configured to activate the active pull-up element to produce a rising edge within a transmission.

6. The communication system of claim 1 wherein the communication circuit is configured to detect an external transmission on the transmission line and, in response to the detected external transmission, deactivate the active pull-up element.

7. A method of communicating on a communication line comprising:
coupling an active pull-down element to the transmission line to pull a voltage on the transmission line low during transmission;
coupling an active pull-up element to the transmission line to pull the voltage on the transmission line high during transmission;
transmitting data onto the transmission line according to a SENT protocol by activating the pull-down element and the pull-up element; and
activating the active pull-up element during a time when transmissions from a slave device and/or a host device are absent from the transmission line to provide immunity to interference on the transmission line.

8. The method of claim 7 wherein the active pull-down element is a first field effect transistor (FET) and the active pull-up element is a second FET and activating the active pull-down element comprises driving a voltage onto a gate terminal of the first FET and activating the active pull-up element comprises driving a voltage onto the gate terminal of the second FET.

9. The method of claim 7 wherein transmitting the data comprises activating the active pull-up element to produce a rising edge of a transmission.

10. The method of claim 7 further comprising detecting an external transmission on the transmission line and, in response to the detected external transmission, deactivating the active pull-up element.

11. The method of claim 7 further comprising:
coupling a second active pull-down element to the transmission line to pull a voltage on the transmission line low during transmission;
coupling a second active pull-up element to the transmission line to pull the voltage on the transmission line high during transmission; and
transmitting data onto the transmission line according to a SENT protocol by activating the second pull-down element and the second pull-up element.

12. The method of claim 11 further comprising pulling the voltage on the transmission line high by the active pull-up element and the second active pull-up element.

13. The method of claim 11 wherein further comprising pulling the voltage on the transmission line high by one of the active pull-up element and the second active pull-up element, but not by both.

14. The method of claim 7 further comprising activating the active pull-up element after a first communication circuit completes a data transmission, and deactivating the active pull-up element upon a second communication circuit starting a data transmission or receiving an external trigger to start a data transmission.

15. A communication system comprising:
a transmission line;
at least one slave device comprising:

an active pull-down element coupled to the transmission line to pull a voltage on the transmission line low during transmission;
an active pull-up element coupled to the transmission line to pull the voltage on the transmission line high during or after transmission; and
a communication circuit configured to transmit data onto the transmission line according to a SENT protocol by activating the pull-down element and the pull-up element;
wherein the communication circuit is configured to activate the active pull-up element during a time when transmissions from the slave device and/or transmissions from a host device are absent from the transmission line to improve immunity to interference on the transmission line.

16. A communication system comprising:
a transmission line;
at least one slave device comprising:
an active pull-down element coupled to the transmission line to pull a voltage on the transmission line low during transmission;
an active pull-up element coupled to the transmission line to pull the voltage on the transmission line high during or after transmission; and
a communication circuit configured to transmit data onto the transmission line according to a SENT protocol by activating the pull-down element and the pull-up element;
wherein the communication circuit is configured to detect an external transmission on the transmission line and, in response to the detected external transmission, deactivate the active pull-up element.

17. A communication system comprising:
a transmission line;
at least one slave device comprising:
    an active pull-down element coupled to the transmission line to pull a voltage on the transmission line low during transmission;
    an active pull-up element coupled to the transmission line to pull the voltage on the transmission line high during or after transmission;
    a communication circuit configured to transmit data onto the transmission line according to a SENT protocol by activating the pull-down element and the pull-up element; and
a second slave device comprising:
    a second active pull-down element coupled to the transmission line to pull a voltage on the transmission line low during transmission;
    a second active pull-up element coupled to the transmission line to pull the voltage on the transmission line high during transmission; and
    a second communication circuit configured to transmit data onto the transmission line according to a SENT protocol by activating the second pull-down element and the second pull-up element;
wherein the communication circuit is configured to activate the active pull-up element during a time when transmissions are absent from the transmission line, and the second communication circuit is configured to activate the second active pull-up element during the time when transmissions are absent from the transmission line.

18. A communication system comprising:
a transmission line;
at least one slave device comprising:
    an active pull-down element coupled to the transmission line to pull a voltage on the transmission line low during transmission;
    an active pull-up element coupled to the transmission line to pull the voltage on the transmission line high during or after transmission;
    a communication circuit configured to transmit data onto the transmission line according to a SENT protocol by activating the pull-down element and the pull-up element; and
a second slave device comprising:
    a second active pull-down element coupled to the transmission line to pull a voltage on the transmission line low during transmission;
    a second active pull-up element coupled to the transmission line to pull the voltage on the transmission line high during transmission; and
    a second communication circuit configured to transmit data onto the transmission line according to a SENT protocol by activating the second pull-down element and the second pull-up element;
wherein the communication circuit is configured to activate the active pull-up element during a time when transmissions are absent from the transmission line, and the second communication circuit is configured to deactivate the second active pull-up element during the time when transmissions are absent from the transmission line.

19. A communication system comprising:
a transmission line;
at least one slave device comprising:
    an active pull-down element coupled to the transmission line to pull a voltage on the transmission line low during transmission;
    an active pull-up element coupled to the transmission line to pull the voltage on the transmission line high during or after transmission;
    a communication circuit configured to transmit data onto the transmission line according to a SENT protocol by activating the pull-down element and the pull-up element; and
a second slave device comprising:
    a second active pull-down element coupled to the transmission line to pull a voltage on the transmission line low during transmission;
    a second active pull-up element coupled to the transmission line to pull the voltage on the transmission line high during transmission; and
    a second communication circuit configured to transmit data onto the transmission line according to a SENT protocol by activating the second pull-down element and the second pull-up element;
wherein the first communication circuit is configured to activate the active pull-up element after the first communication circuit completes a data transmission, and to deactivate the active pull-up element upon the second communication circuit starting a data transmission or receiving an external trigger to start a data transmission.

20. A method of communicating on a communication line comprising:
coupling an active pull-down element to the transmission line to pull a voltage on the transmission line low during transmission;
coupling an active pull-up element to the transmission line to pull the voltage on the transmission line high during transmission; and transmitting data onto the transmission line according to a SENT protocol by activating the pull-down element and the pull-up element;

detecting an external transmission on the transmission line and, in response to the detected external transmission, deactivating the active pull-up element.

21. A method of communicating on a communication line comprising:

coupling an active pull-down element to the transmission line to pull a voltage on the transmission line low during transmission;

coupling an active pull-up element to the transmission line to pull the voltage on the transmission line high during transmission;

transmitting data onto the transmission line according to a SENT protocol by activating the pull-down element and the pull-up element;

coupling a second active pull-down element to the transmission line to pull a voltage on the transmission line low during transmission;

coupling a second active pull-up element to the transmission line to pull the voltage on the transmission line high during transmission;

transmitting data onto the transmission line according to a SENT protocol by activating the second pull-down element and the second pull-up element; and pulling the voltage on the transmission line high by one of the active pull-up element and the second active pull-up element, but not by both.

22. A method of communicating on a communication line comprising:

coupling an active pull-down element to the transmission line to pull a voltage on the transmission line low during transmission;

coupling an active pull-up element to the transmission line to pull the voltage on the transmission line high during transmission;

transmitting data onto the transmission line according to a SENT protocol by activating the pull-down element and the pull-up element; and activating the active pull-up element after a first communication circuit completes a data transmission, and deactivating the active pull-up element upon a second communication circuit starting a data transmission or receiving an external trigger to start a data transmission.

* * * * *

UNITED STATES PATENT AND TRADEMARK OFFICE
CERTIFICATE OF CORRECTION

PATENT NO. : 10,326,621 B1
APPLICATION NO. : 15/968291
DATED : June 18, 2019
INVENTOR(S) : Dominik Geisler et al.

Page 1 of 1

It is certified that error appears in the above-identified patent and that said Letters Patent is hereby corrected as shown below:

In the Specification

Column 2, Line 24, delete "low-to high" and replace with --low-to-high--

Column 6, Line 44, delete "box 405 If" and replace with --box 405. If--

Column 6, Line 46, delete "box 406" and replace with --box 406.--

Column 7, Line 2, delete "protocol being used in" and replace with --protocol being used is--

Column 7, Line 21, delete "bus" and replace with --bus.--

In the Claims

Column 7, Line 64, delete "is second a FET." and replace with --is a second FET.--

Signed and Sealed this
Seventeenth Day of March, 2020

Andrei Iancu
*Director of the United States Patent and Trademark Office*